(12) United States Patent
Langenberg et al.

(10) Patent No.: US 10,935,057 B2
(45) Date of Patent: Mar. 2, 2021

(54) ADAPTER PLATE FOR HF STRUCTURES

(71) Applicant: Telefonaktiebolaget LM Ericsson (publ), Stockholm (SE)

(72) Inventors: Jörg Langenberg, Rosenheim (DE); Florian Leinenbach, Rosenheim (DE); Philipp Ponn, Rosenheim (DE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/595,631

(22) Filed: May 15, 2017

(65) Prior Publication Data

US 2017/0328392 A1    Nov. 16, 2017

(30) Foreign Application Priority Data

May 13, 2016    (DE) .................. 10 2016 108 868.4

(51) Int. Cl.
*H01Q 21/00* (2006.01)
*F16B 5/00* (2006.01)
*H01Q 21/08* (2006.01)
*H05K 3/00* (2006.01)
*H05K 9/00* (2006.01)
*H01Q 21/26* (2006.01)
(Continued)

(52) U.S. Cl.
CPC .............. *F16B 5/0024* (2013.01); *F16B 5/02* (2013.01); *H01Q 21/08* (2013.01); *H01Q 21/26* (2013.01); *H05K 3/0061* (2013.01); *H05K 9/006* (2013.01); *H05K 3/3447* (2013.01); *H05K 2201/093* (2013.01); *H05K 2201/09036* (2013.01); *H05K 2201/09063* (2013.01); *H05K 2201/09072* (2013.01); *H05K 2201/09718* (2013.01); *H05K 2201/09745* (2013.01); *H05K 2201/10371* (2013.01); *H05K 2201/2036* (2013.01)

(58) Field of Classification Search
CPC .............. H01R 13/648; H01R 13/6485; H01R 13/65802; H01R 13/6596; H01R 4/30; H01R 9/0512
See application file for complete search history.

(56) References Cited

U.S. PATENT DOCUMENTS 3,231,341 A * 1/1966 Sump ..................... B29C 70/12
                                                        248/346.01
4,927,367 A * 5/1990 Salvagno ............. H05K 9/0039
                                                           200/507
5,455,741 A    10/1995 Inai et al.
(Continued)

FOREIGN PATENT DOCUMENTS

CN    204905445 U    12/2015
EP      2849549 A1    3/2015

OTHER PUBLICATIONS

Riehl ( EP 2849549 A1 English Translation) (Year: 2014).*

*Primary Examiner* — Pete T Lee
(74) *Attorney, Agent, or Firm* — Coats & Bennett, PLLC

(57) ABSTRACT

What is provided is an adapter plate for HF structures, which is set up for being disposed between a back of a circuit board and a reflector, wherein the adapter plate is electrically conductive, and the adapter plate has an opening or a cavity at every location where an element is passed through the circuit board to the side of the adapter plate, wherein at least one element is passed through the circuit board exclusively for ground contacting.

8 Claims, 5 Drawing Sheets

(51) Int. Cl.
*F16B 5/02* (2006.01)
*H05K 3/34* (2006.01)

(56) References Cited

U.S. PATENT DOCUMENTS

| | | | |
|---|---|---|---|
| 5,771,024 A * | 6/1998 | Reece | H01Q 1/38 |
| | | | 343/725 |
| 5,798,908 A | 8/1998 | Herzberger et al. | |
| 6,545,873 B1 | 4/2003 | Han et al. | |
| 7,387,518 B2 * | 6/2008 | Kozlovski | F16B 5/0258 |
| | | | 439/92 |
| 8,159,833 B2 * | 4/2012 | Ishii | H05K 1/0215 |
| | | | 174/262 |
| 2008/0055861 A1 * | 3/2008 | Nagareda | H01L 23/467 |
| | | | 361/707 |
| 2009/0059539 A1 * | 3/2009 | Ryu | H04N 5/44 |
| | | | 361/736 |
| 2014/0111684 A1 * | 4/2014 | Corbin | H04N 5/2257 |
| | | | 348/374 |

* cited by examiner

ADAPTER PLATE FOR HF STRUCTURES

This application claims priority to Germany Patent Application No. 10 2016 108 868.4, filed May 13, 2017.

FIELD OF THE INVENTION

The invention relates to an adapter plate for HF structures.

BACKGROUND OF THE INVENTION

In high-frequency (HF) arrangements, shield housings or shielding elements are used, for example, for shielding interference radiation of or on electrical circuits. In this regard, it is considered to be sufficient shielding if the greatest possible shielding attenuation is achieved in the working ranges or frequency ranges of the circuit boards to be shielded or of the (antenna) system. Shield housings are widespread in electrical technology, in the most varied embodiments, and different approaches can also be found in antenna technology and filter technology.

Because elements project through the circuit board during installation, capacitive coupling of the ground surface of the circuit board is impaired. If the module is supposed to be attached to a reflector or support element, openings are required, which not only impair the coupling surface but also influence the electrical properties. In addition, the mechanical stability of the reflector or support element is impaired as a result. Furthermore, assembly is complicated.

It is the task of this invention to provide an adapter plate that facilitates assembly but does not distort the electrical properties in the process.

This task is accomplished, according to the invention, by means of the characteristics of claim 1. Advantageous embodiments are the object of the dependent claims.

SUMMARY OF THE INVENTION

What is proposed is an adapter plate for HF structures, which is set up for being disposed between a back of a circuit board and a reflector, wherein the adapter plate is electrically conductive, and the adapter plate has an opening or a cavity at every location at which an element is passed through the circuit board to the side of the adapter plate, wherein at least one element is passed through the circuit board exclusively for ground contacting.

In one embodiment, at least one further element is configured as an inner conductor pin.

In a further embodiment, the thickness of the adapter plate is selected in such a manner that it corresponds to a length of the longest element passed through the circuit board to the side of the adapter plate. By providing the adapter plate, a full-area reflector or support element can be used, i.e. no holes or recesses have to be provided in the reflector. This has the advantage that disruptive influences on the reflector, caused by the pins that project through the circuit board, are avoided. Thereby the adapter plate produces the required distance between circuit board and reflector, so that elements passing through on the underside of the board, in the direction of the reflector, do not make contact and thereby capacitive coupling of the ground surface of the circuit board with the reflector can take place.

What is furthermore proposed is an adapter plate for HF structures, which plate is set up for being disposed between a back of a circuit board and a reflector, wherein the adapter plate has a domed area at every location where an element is passed through the circuit board to the side of the adapter plate, in which area the element is accommodated.

By providing an adapter plate that has a domed area at locations where elements project through the circuit board, by means of which area these elements are covered, disruptive influences on the reflector caused by the elements that project through the circuit board can be prevented by means of the shield effect of the adapter plate.

Furthermore, it is provided in one embodiment that the adapter plate is configured in such a manner that it comprises a recess for conducting at least one cable. It is advantageous if the recess is configured as a shield element for shielding the radiating part of the at least one cable.

By providing the adapter plate, further components, such as, for example, a cable guide can be integrated into the adapter plate. This can be done by means of stamping, casting or deep-drawing the plate, so that no separate component has to be affixed to the plate. It is advantageous if the guide is simultaneously configured as a shield element for the radiating part of the cable to be attached. In this way, the interface of the connection line can be shielded, for example, thereby making it possible to avoid sheath currents and undesirable coupling.

In an advantageous embodiment, the adapter plate is configured in such a manner that it comprises a fixation element for fixing at least one cable in place.

By providing a cable fixation, regardless of whether this is done with or without an additional cable guide, installation of the cable is simplified and also, tension relief and/or torsion relief is provided for the cable. The electrical contact of the outer conductor can be integrated into the adapter plate, and thereby a solder connection of the outer conductor on the circuit board can be avoided.

In a further embodiment, it is provided that the adapter plate comprises electrically conductive surrounding elements. This has the advantage that more room for other elements remains on the circuit board.

In a further embodiment, the adapter plate is made of plastic that has a conductive coating or conductive properties.

In an advantageous embodiment, the adapter plate comprises at least a wall, which is drawn out of the adapter plate over at least a partial region of the outer edge of the circuit board over at least a partial region of the outer circumference of the plate.

The advantage of providing one or more wall or walls drawn from the adapter plate above the outer edge of the circuit board is that integration of part of the radiation environment into the adapter plate is possible, i.e. that no additional components to be affixed, such as partition walls for shielding against adjacent components are necessary. Thereby a flexible structure of antennas having prefabricated modules can also take place. By providing the wall or walls over the edge of the circuit board, the circuit board can be incorporated into the adapter plate, and thereby a compact and shielded module can be provided, which module can be variably put together with other modules, as a total package. In addition, the circuit board is protected and reinforced, for example for transport.

Furthermore, it is provided that the at least one wall is formed from the adapter plate in one piece, wherein it forms a closed trough in which the circuit board, with HF components disposed on it, can be disposed.

Providing a trough formed by the wall or walls additionally increases the effects mentioned above. By forming the trough as a one-piece element, for example by means of deep-drawing, simple and cost-advantageous production is implemented. In addition, no further components that have to be installed on the adapter plate or the circuit board are required to achieve shielding and reinforcement of the circuit board.

In an advantageous embodiment, it is provided that at least one further electrical functional component is formed in the adapter plate, in one piece with and from the adapter plate. It is advantageous if the at least one electrical functional component is an integral part of a radiator of a multi-band antenna. By providing functional components that are drawn from the board in one piece, it is also avoided that components that need to be additionally installed are required. Furthermore, the production process is simplified, since multiple parts can be produced at the same time during production of the adapter plate.

It is furthermore provided, within the scope of an embodiment of the present invention, that the adapter plate be formed by means of a deep-drawing method and/or made of plastic that has a conductive coating or conductive properties.

Even complex structures can be implemented by means of the deep-drawing method, for example round, parabolic, square or asymmetrical. A structure can be calculated for a radiation environment by means of automated design based on simulations, and then can be easily produced, which structure demonstrates optimal shielding for the desired application. Depending on the method, plastics that are coated with a material that has conductive properties can be used.

Furthermore, it is provided that the elements passed through the circuit board to the side of the adapter plate comprise connectors or pins, at least one screw connection for HF components on the circuit board and/or cable connectors.

By means of one of the adapter plates according to the invention, any elements that project through the circuit board can be shielded, by means of either a corresponding selection of the thickness of the adapter plate or correspondingly configured domed areas. Therefore the function of the reflector is not impaired by means of disruptive electrical contacts, fields or other influences.

In a further embodiment, it is provided that at least one adapter plate with the related circuit board can be attached on a rail system that serves as a reflector.

What is advantageous in using a rail system is that installation is kept simple here. Furthermore, a reflector can be installed.

Furthermore, an antenna arrangement is provided, comprising at least one adapter plate described above and a reflector, wherein the at least one adapter plate is set up for being disposed on the reflector, wherein the reflector has at least one reflector recess, which lies opposite at least one corresponding depression of the adapter plate or accommodates it.

Therefore the reflector can be coupled with the adapter plate directly, i.e. at the smallest possible distance from it. Although recesses are provided in the reflector, no disruptive influences from the circuit board or the elements that project through it are in effect, because the adapter plate shields these by means of the domed areas that cover the elements.

Further characteristics and advantages of the invention are evident from the following description of exemplary embodiments of the invention, from the figures of the drawing, which shows details according to the invention, and from the claims. The individual characteristics can be implemented individually, on their own, in each instance, or with multiple characteristics in any desired combination, in a variant of the invention.

Preferred embodiments of the invention will be explained in greater detail below, using the attached drawing.

DETAILED DESCRIPTION

In the following figure descriptions, the same elements or functions are provided with the same reference symbols.

Figure 1:
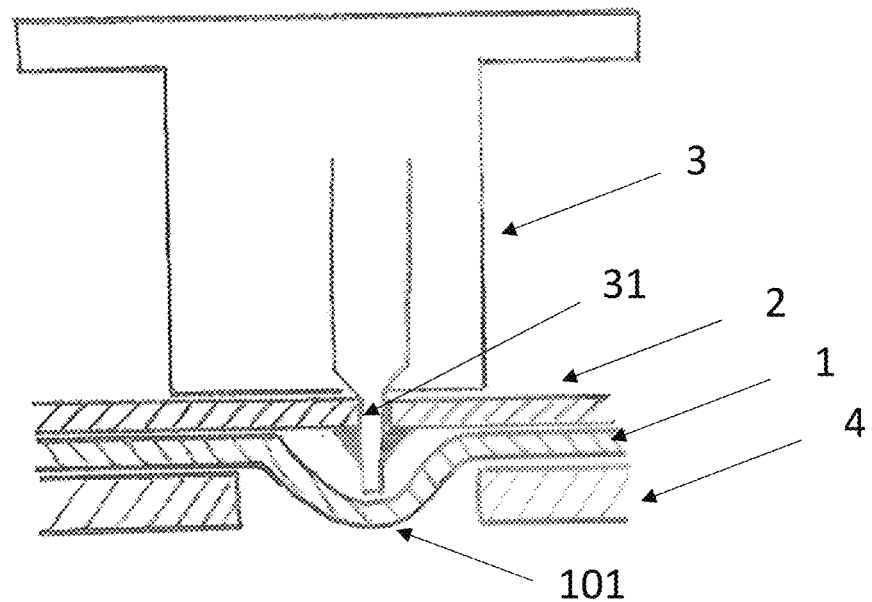
FIG. 1 shows a representation of an adapter plate according to an embodiment of the present invention.

FIG. 1 shows an embodiment of an adapter plate 1 according to the invention, which is designed in such a manner that elements 31, for example pins, of a component 3 disposed on the circuit board 2, here a dipole, for example, which project through the back of the circuit board 2, are shielded in that the adapter plate has an outward bulge 101 at locations where elements 31 project through the circuit board. The reflector 4, which is disposed below the adapter plate 1, can or should have a recess or gap at these locations, so that the outward bulge or cavity 101 of the adapter plate 1 has sufficient room. The pin is shielded here.

Figure 2:
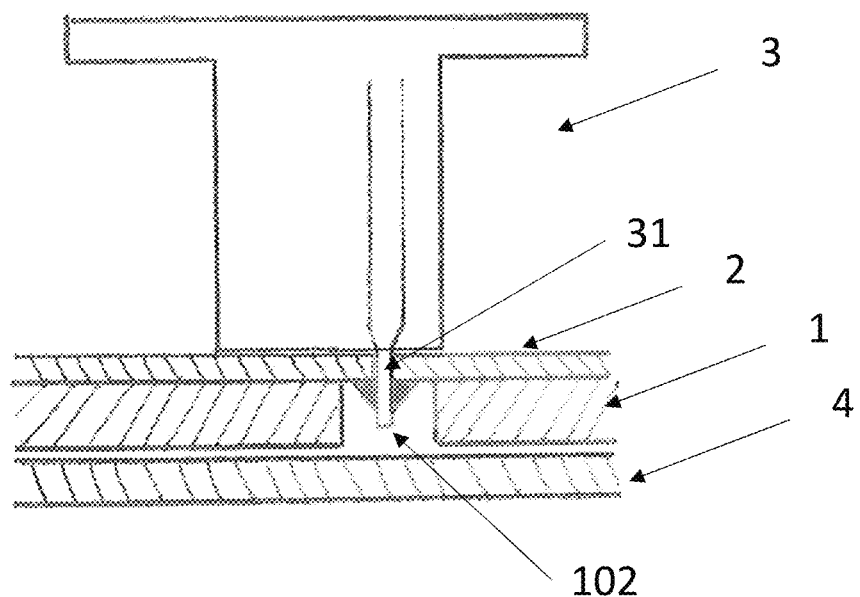
FIG. 2 shows a representation of an adapter plate according to a further embodiment of the present invention.

An alternative equivalent adapter plate 1 according to the invention is shown in FIG. 2. Here, an adapter plate 1 is also provided between the circuit board 2 and the reflector 4. In this embodiment, however, the adapter plate 1 is configured in such a manner that it has a gap or opening 102 at locations where an element 31 projects through the circuit board 2, in which the element 31 is accommodated. It is advantageous if the adapter plate 1 therefore has a thickness that corresponds at least to the length of the element 31 that projects farthest through the circuit board 2. Based on the thickness requirement, the adapter plate 1 can accommodate every element 31, and the reflector 4 can be formed over the full area of the entire underside of the circuit board 2 and the adapter plate 1, i.e. no holes need to be drilled into the sheet metal of the reflector, so that no disruptive influences act on the reflector.

The adapter plate 1, in both embodiments, can be electrically insulated by means of sufficiently thin films and/or varnish and/or suitable coatings, so that capacitive coupling between the ground surface of the circuit board 2 and the reflector 4 can be made possible.

Figure 3:
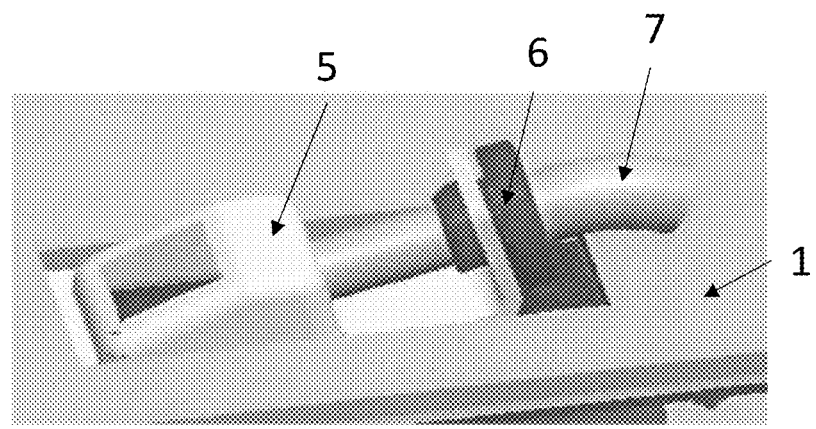
FIG. 3 shows a representation of a cable guide and cable fixation on the adapter plate, according to a further embodiment of the present invention.

FIG. 3 shows a cable guide 5 and cable fixation 6 disposed on the adapter plate 1 and formed out of the adapter plate 1. A connection line 7, for example a coaxial cable, can be attached in the cable guide 6, for example. It is advantageous if the cable guide 5 simultaneously serves as a shielding element that electrically shields the radiating part of the cable 7. It is advantageous if the cable guide 5 has a hole or a recess at the location where the cable 7 is supposed to be soldered onto the circuit board 2 or attached to the circuit board 2.

The cable fixation 6 shown in FIG. 3 is advantageous not only for installation of the cable 7 but also during operation, because it offers tension relief and/or torsion relief for the contact location of the cable 7. A cable fixation 6 formed out of the adapter plate 1 can also be provided without a cable guide 5 and vice versa.

The cable guide 5 and cable fixation 6 can be formed out of the adapter plate 1 by means of punching, stamping or during casting, or integrated into a gap of the adapter plate 1 as a separate component between the adapter plate 1 and the circuit board 2, as shown in FIG. 3.

Figure 4:
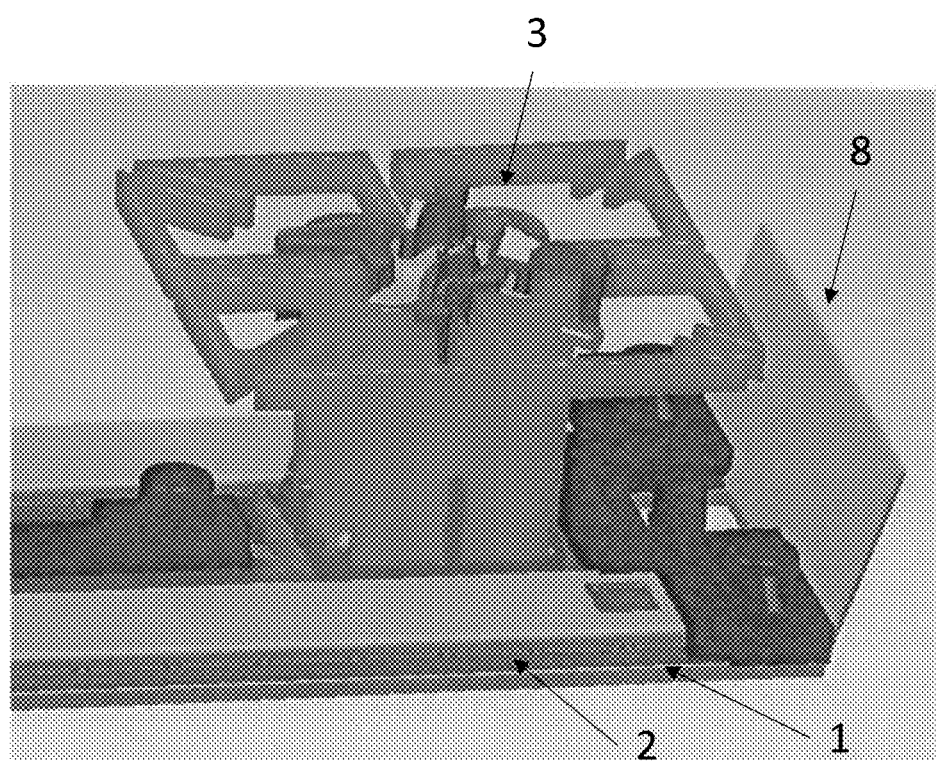
FIG. 4 shows a representation of a wall drawn out of the adapter plate and over the outer edge of the circuit board, according to an embodiment of the present invention.

FIG. 4 shows a wall 8 disposed on the adapter plate 1 and formed out of the adapter plate 1, which is drawn over the outer edge of the circuit board or can be folded over. A single wall 8 drawn out of the adapter plate 1 can serve as a partition wall for shielding individual components 3 or components of an antenna, for example dipoles, etc., from one another or from other components 3 or components disposed adjacent to them. The radiation properties, particularly the environment shaping, are influenced by this. Therefore no further component is required and assembly is simplified.

Figure 5:
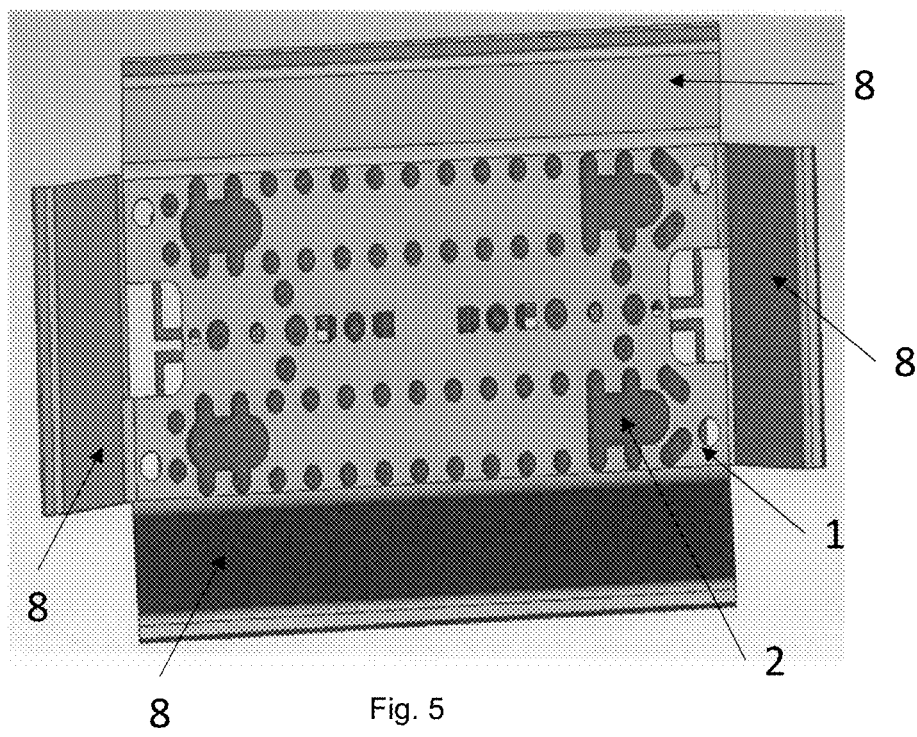
FIG. 5 shows a bottom view of an adapter plate having multiple walls drawn from it and over the outer edge of the circuit board, according to a further embodiment of the present invention.

FIG. 5 shows a bottom view of an adapter plate 1 having four walls 8 that can be drawn out of or folded over the outer edge of the circuit board 2. The walls 8 shown in FIG. 5 are disposed on the respective two long sides and the two short sides of the adapter plate 1. They can be produced, for example, in that they are punched out of sheet metal that forms the adapter plate 1. By bending or folding the walls 8 over the outer edge of the circuit board 2, the walls 8 then form a type of housing around the circuit board 2 and the components situated on it, so that a radiation environment can be reproduced, and shielding against external influences can take place. In addition, a system is provided that comprises all the components disposed on the circuit board 2, for example two dipole radiators, etc., disposed on the circuit board 2, and therefore can be placed, as a complete set, in environments in which a conventional construction would be difficult to place, because installation would be too complicated or a flexible structure would be required.

Figure 6:
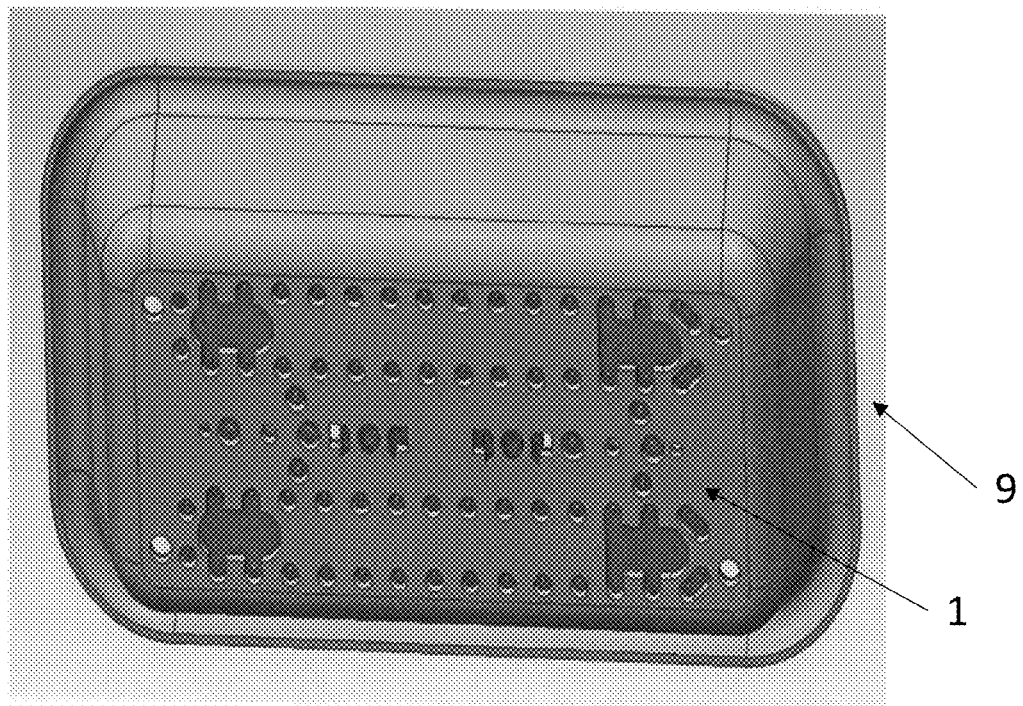
FIG. 6 shows a bottom view of an adapter plate configured in one piece as a trough, according to a further embodiment of the present invention.

FIG. 6 shows a bottom view of an adapter plate 1 formed in one piece as a trough 9. In this embodiment, the adapter plate 1, including the walls 8, can be formed in one piece, for example by casting or deep-drawing. As a result, no further elements are required, which have to hold individual walls together, i.e. significantly more cost-advantageous production and simpler assembly can be implemented. Because of the possibility of deep-drawing the adapter plate 1 with the walls 8, any desired shapes can be implemented, as described above, so that circuit boards 2 and components 3 having any desired shape and size are enclosed by the adapter plate 1. Because of the possibility of determining the shape for reproducing the radiation environment by means of computer-assisted simulation, planning of the shape for the adapter plate 1 is furthermore facilitated.

In addition, the circuit board 2 is stabilized by means of the shape that surrounds the circuit board 2, so that there is a lower risk of breakage or risk of damage caused by transport of the circuit board, for example.

Figure 7:
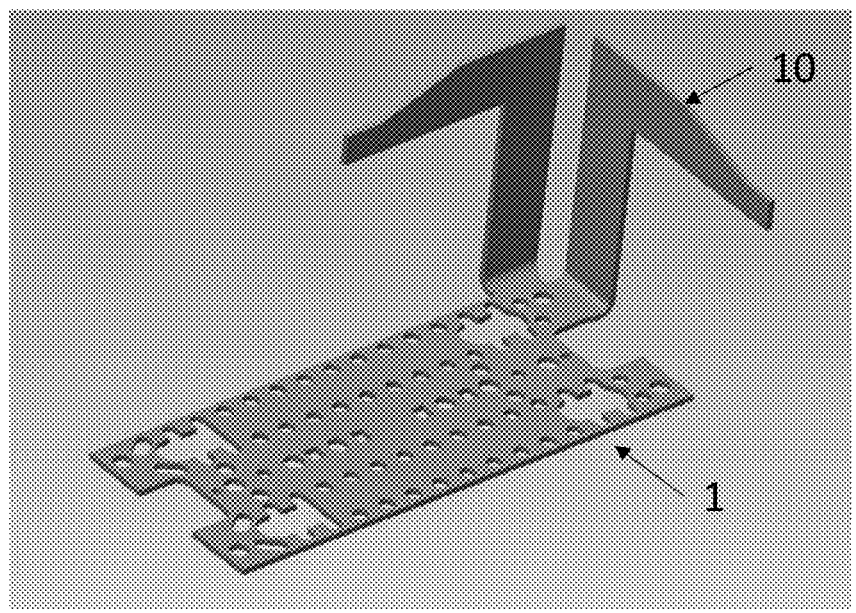
FIG. 7 shows a representation of a structure drawn from the adapter plate and over the outer edge of the circuit board, which structure serves as an integrated electrical functional component, according to an embodiment of the present invention.

FIG. 7 shows a representation of a structure drawn out of the adapter plate and over the outer edge of the circuit board, which structure serves as an integrated electrical functional component. Here, openings for the inner conductor are furthermore shown, which minimize the likelihood of the occurrence of coupling effects.

Figure 8:
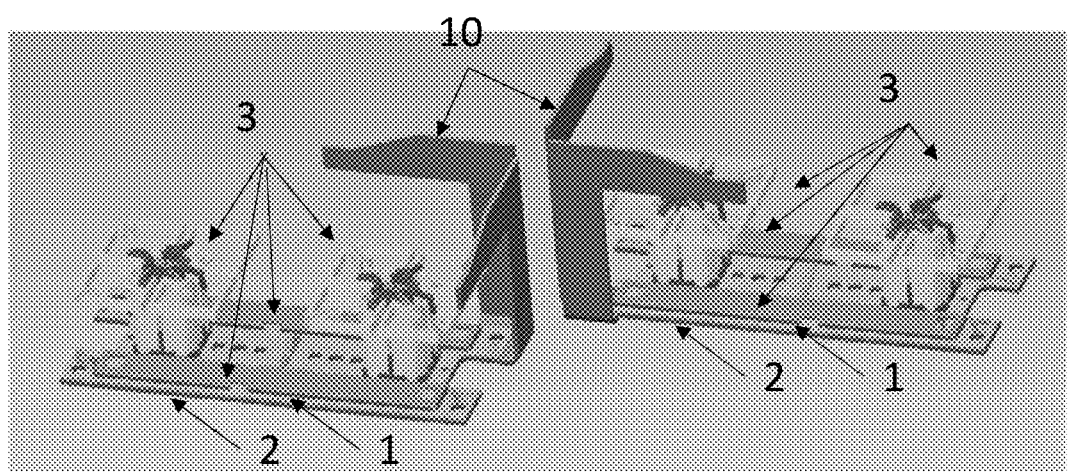
FIG. 8 shows a representation of structures shown in FIG. 7 and disposed next to one another, which together form a radiation element, according to an embodiment of the present invention.

FIG. 8 shows a representation of structures shown in FIG. 7 and disposed next to one another, which together form a radiation element 10. What is shown in FIG. 7 is the principle of integration of at least one part of an electrical functional component 10 into the adapter plate 1. This electrical functional component 10 can be formed with the adapter plate 1, for example by means of casting, deep-drawing or punching, and is formed in one piece with the adapter plate 1. This simplifies production and assembly. In FIG. 8, the method of functioning is shown as an example. Two adapter plates 1 with a circuit board 2 and components 3 disposed on them are disposed adjacent to one another in such a manner that the respective electrical functional components 10 lie opposite one another, at a distance from one another, and thereby produce a radiation element 10, in combination, for example a low-band radiation element.

Figure 9:
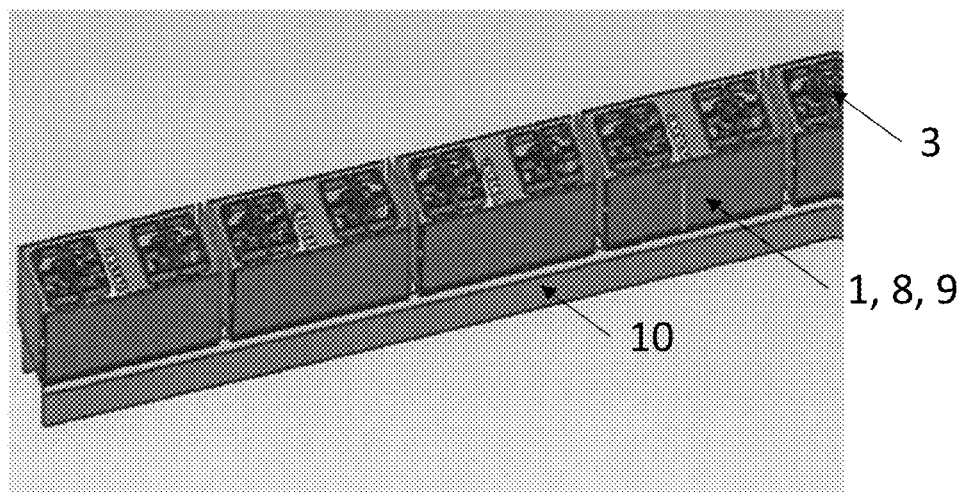
FIG. 9 shows a representation of component complexes disposed on a rail system, according to an embodiment of the present invention.

FIG. 9 shows a representation of component complexes disposed on a rail system, comprising at least one adapter plate 1 disposed on a circuit board 2 equipped with components 3, which plate has walls 8 that are drawn upward or a trough 9. Since a component complex or a complete set can be provided by means of the embodiments of the present invention, it is possible to dispose the individual component complexes on a rail system 11, so that no complicated reflector is required any longer.

The present invention, with its modifications, provides an adapter plate by means of which no properties of the reflector are reduced or disrupted on the basis of elements that project through the circuit board. In addition, the sensitive circuit board is reinforced by means of the adapter plate and is therefore less susceptible to damage due to transport, for example. Furthermore, parts of the radiation environment can be coupled with the adapter plate, and a shape in accordance with the application for the adapter plate can be selected, i.e. the flexibility both for placement of the component complex within an antenna, for example, and production are clearly simplified and become more flexible.

REFERENCE SYMBOL LIST

1 adapter plate
101 outward bulge or outward dome
102 gap or opening in adapter plate
2 circuit board
3 component
31 element that projects through the circuit board
4 reflector
5 cable guide
6 cable fixation
7 cable

8 wall
9 trough
10 radiation element
11 rail system

What is claimed is:

1. An adapter plate for HF structures, which is electrically conductive and set up for being disposed between a back of a circuit board and a reflector, wherein an element is passed through the circuit board to the side of the adapter plate, wherein the adapter plate at every location where an element is passed through the circuit board to the side of the adapter plate has an opening into which the element protrudes out of contact with the adapter plate and the reflector closing the opening and wherein the adapter plate has thickness such that (i) the bottommost surface of the element is level with a bottom most surface of the adapter plate or (ii) the bottommost surface of the element is above the bottommost surface of the adapter plate or an outward bulge into which the element protrudes out of contact therewith, said outward bulge extending into a recess or gap of the reflector out of contact therewith, wherein at least one element is passed through the circuit board exclusively for ground contacting.

2. The adapter plate for HF structures according to claim 1, wherein at least one further element is configured as an inner conductor pin.

3. The adapter plate for HF structures according to claim 1, wherein the adapter plate is configured in such a manner that it comprises a recess for guiding at least one cable.

4. The adapter plate for HF structures according to claim 3, wherein the recess is configured as a shield element for shielding the radiating part of the at least one cable.

5. The adapter plate for HF structures according to claim 1, wherein the adapter plate is configured in such a manner that it comprises a fixation element for fixation of at least one cable.

6. The adapter plate for HF structures according to claim 1, wherein the adapter plate is made of plastic that has a conductive coating or conductive properties.

7. The adapter plate for HF structures according to claim 1, wherein the adapter plate is formed by means of a deep-drawing method.

8. The adapter plate for HF structures according to claim 1, wherein the elements passed through the circuit board to the side of the adapter plate comprise connectors or pins, at least one attachment for HF components on the circuit board and/or cable connectors.

* * * * *